US010872912B2

(12) United States Patent
Wang et al.

(10) Patent No.: US 10,872,912 B2
(45) Date of Patent: Dec. 22, 2020

(54) DISPLAY SUBSTRATE AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Ying Wang, Beijing (CN); Hongmin Li, Beijing (CN); Liqing Liao, Beijing (CN); Li Sun, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 24 days.

(21) Appl. No.: 16/319,704

(22) PCT Filed: May 11, 2018

(86) PCT No.: PCT/CN2018/086568
§ 371 (c)(1),
(2) Date: Jan. 22, 2019

(87) PCT Pub. No.: WO2018/219126
PCT Pub. Date: Dec. 6, 2018

(65) Prior Publication Data
US 2019/0333943 A1 Oct. 31, 2019

(30) Foreign Application Priority Data
May 27, 2017 (CN) .......................... 2017 1 0393775

(51) Int. Cl.
*H01L 27/12* (2006.01)
*G02F 1/1362* (2006.01)
(Continued)

(52) U.S. Cl.
CPC .... *H01L 27/1262* (2013.01); *G02F 1/136204* (2013.01); *H01L 23/60* (2013.01); *H01L 27/0266* (2013.01); *H01L 27/124* (2013.01)

(58) Field of Classification Search
CPC ............. H01L 27/1262; H01L 27/0266; H01L 27/124; H01L 27/1214–1296; H01L 23/60–62; G02F 1/136204
See application file for complete search history.

(56) References Cited

U.S. PATENT DOCUMENTS

2005/0285984 A1* 12/2005 Tsai .................. G02F 1/136204
349/40
2006/0279667 A1* 12/2006 Tsai .................... G02F 1/13454
349/40
(Continued)

FOREIGN PATENT DOCUMENTS

CN 202332851 U 7/2012
CN 202712185 U 1/2013
(Continued)

OTHER PUBLICATIONS

International Search Report and Written Opinion dated Jul. 25, 2018; PCT/CN2018/086568.

*Primary Examiner* — Shahed Ahmed

(57) ABSTRACT

A display substrate and a display device. The display substrate includes a signal line, an electro-static lead-out line, and an electro-static discharge unit including a first thin film transistor, a third thin film transistor and a fourth thin film transistor; a drain electrode and a gate electrode of the first thin film transistor are connected to the signal line; a source electrode of the first thin film transistor, a gate electrode of the third thin film transistor and a gate electrode of the fourth thin film transistor are connected to a first node; a drain electrode of the third thin film transistor and a drain electrode of the fourth thin film transistor are connected to the
(Continued)

signal line; a source electrode of the third thin film transistor and a source electrode of the fourth thin film transistor are connected to the electro-static lead-out line.

15 Claims, 3 Drawing Sheets

(51) Int. Cl.
*H01L 23/60* (2006.01)
*H01L 27/02* (2006.01)

(56) References Cited

U.S. PATENT DOCUMENTS

| | | |
|---|---|---|
| 2007/0246778 A1 | 10/2007 | Liou et al. |
| 2014/0092510 A1* | 4/2014 | Huang .................. H02H 9/045 361/56 |
| 2014/0126094 A1* | 5/2014 | Duan .................. H01L 27/0296 361/56 |
| 2014/0192444 A1* | 7/2014 | Wu ..................... H01L 27/0296 361/56 |
| 2016/0155736 A1* | 6/2016 | Kim ...................... G02F 1/1345 257/43 |
| 2018/0052372 A1 | 2/2018 | Xu |
| 2018/0203311 A1* | 7/2018 | Long .................. G02F 1/13454 |
| 2019/0204693 A1* | 7/2019 | Chen ........................ G09G 3/20 |

FOREIGN PATENT DOCUMENTS

| | | |
|---|---|---|
| CN | 105739206 A | 7/2016 |
| CN | 205810810 U | 12/2016 |
| JP | 2006-196584 A | 7/2006 |

\* cited by examiner

DISPLAY SUBSTRATE AND DISPLAY DEVICE

The present application claims priority to Chinese patent application No. 201710393775.3, filed on May 27, 2017, the entire disclosure of which is incorporated herein by reference as part of the present application.

TECHNICAL FIELD

Embodiments of the present disclosure relate to a display substrate and a display device.

BACKGROUND

An electro-static discharge (ESD) unit is an important component portion of a thin film transistor-liquid crystal display (TFT-LCD) substrate and an active-matrix organic light emitting diode (AMOLED) substrate. An electro-static discharge unit is configured to reduce electro-static damage to the display substrate during a plurality of processes in a manufacturing method of the display substrate such as development, etching, and bonding, thereby improving the yield of the display substrate.

SUMMARY

At least one embodiment of the present disclosure provides a display substrate and a display device, which can reduce a wiring space occupied by an electro-static discharge unit and improve the reliability of the electro-static discharge unit.

Therefore, at least one embodiment of the present disclosure provides a display substrate, including a signal line located in a display region of the display substrate, and an electro-static discharge unit and an electro-static lead-out line in a frame region of the display substrate, wherein the electro-static discharge unit includes a first thin film transistor, a second thin film transistor, a third thin film transistor and a fourth thin film transistor; a drain electrode and a gate electrode of the first thin film transistor are connected to the signal line; a drain electrode and a gate electrode of the second thin film transistor are connected to the electro-static lead-out line; a source electrode of the first thin film transistor, a source electrode of the second thin film transistor, a gate electrode of the third thin film transistor and a gate electrode of the fourth thin film transistor are connected to a first node; a drain electrode of the third thin film transistor and a drain electrode of the fourth thin film transistor are connected to the signal line; a source electrode of the third thin film transistor and a source electrode of the fourth thin film transistor are connected to the electro-static lead-out line.

In the abovementioned display substrate provided by an embodiment of the present disclosure, a channel length-width ratio of the fourth thin film transistor is the same as that of the third thin film transistor.

In the abovementioned display substrate provided by an embodiment of the present disclosure, the electro-static discharge unit further includes: a fifth thin film transistor, a drain electrode and a gate electrode of the fifth thin film transistor are connected to the signal line; a source electrode of the fifth thin film transistor is connected to the first node.

In the abovementioned display substrate provided by an embodiment of the present disclosure, a channel length-width ratio of the fifth thin film transistor is the same as that of the first thin film transistor.

In the abovementioned display substrate provided by an embodiment of the present disclosure, the electro-static discharge unit further includes: a sixth thin film transistor; a drain electrode and a gate electrode of the sixth thin film transistor are connected to the electro-static lead-out line; a source electrode of the sixth thin film transistor is connected to the first node.

In the abovementioned display substrate provided by an embodiment of the present disclosure, a channel length-width ratio of the sixth thin film transistor is the same as that of the second thin film transistor.

In the abovementioned display substrate provided by an embodiment of the present disclosure, the signal line is one or a combination of a data signal line, a gate electrode signal line, a control signal line, a clock signal line, and a test signal line.

In the abovementioned display substrate provided by an embodiment of the present disclosure, the electro-static lead-out line is grounded, or the electro-static lead-out line is a common electrode line.

At least one embodiment of the present disclosure provides a display device, including the display substrate provided by the abovementioned embodiments.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
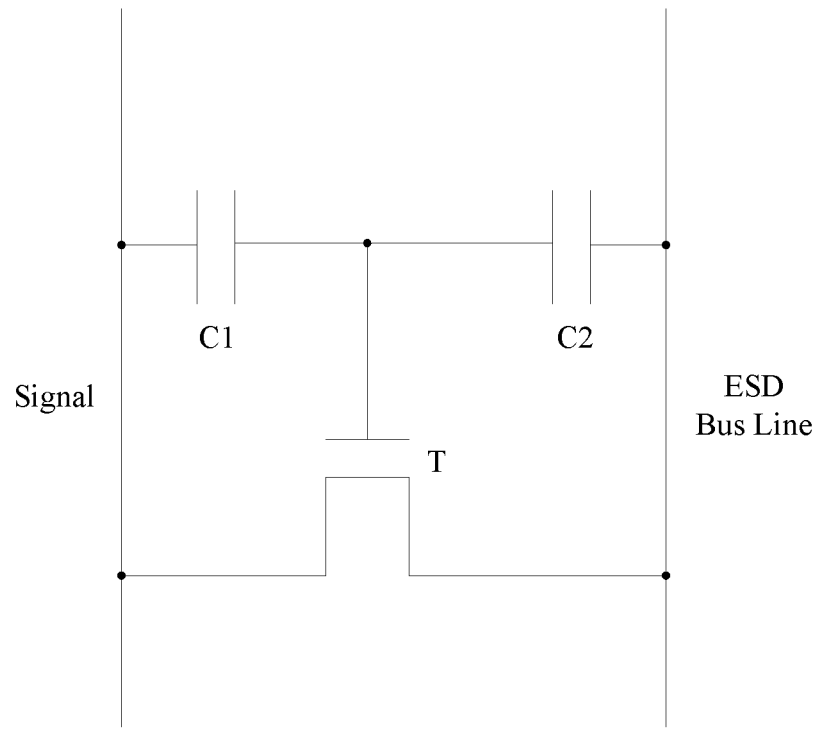
FIG. 1 is a schematic structural view of an electro-static discharge unit.
Figure 2:
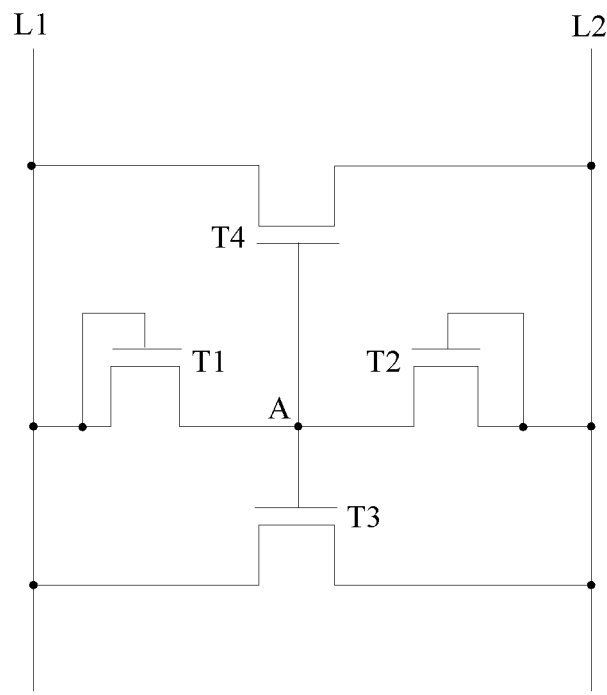
FIG. 2 to FIG. 5 are schematic structural views of an electro-static discharge unit provided by at least one embodiment of the present disclosure.

As illustrated in FIG. 1, an electro-static discharge unit is consisted of two capacitors C1, C2 and a thin film transistor T. Upon a large amount of static electricity being accumulated on a signal line of the signal end Signal, a left electrode of the capacitor C1 becomes a high potential, a right electrode of the capacitor C1 also becomes a high potential by a charge induction, thereby turning on the thin film transistor T. In this case, the static electricity at the signal end can be discharged through the thin film transistor T to the ESD bus line. Base on the same principle, upon a large amount of the static electricity being accumulated on the ESD bus line, the thin film transistor T is controlled to be turned on by the capacitor C2, so that the static electricity of the ESD bus line is discharged through the thin film transistor T to each signal line of the signal end, thereby being guided by a corresponding signal power source.

However, because the capacitor has a larger volume, in the design of the display substrate, the electro-static discharge unit occupies a large wiring space, so that the display region of the display substrate has a relatively small area, and the frame region has a relatively large area. And, in the electro-static discharge unit illustrated in FIG. 1, the static electricity is discharged only through the thin film transistor T. Once the thin film transistor T is damaged, the electro-static discharge unit may be disabled, so that the static electricity cannot be discharged, and the risk of the display substrate being electro-statically broken down is increased. Therefore, how to reduce the large wiring space occupied by the electro-static discharge unit and improve the reliability of the electro-static discharge unit are technical problems that need to be solved by those skilled in the art at present.

At least one embodiment of the present disclosure provides a display substrate, including: a signal line located in a display region of the display substrate, and an electro-static discharge unit and an electro-static lead-out line in a frame region of the display substrate.

As illustrated in FIG. 2 to FIG. 5, the electro-static discharge unit includes a first thin film transistor T1, a second thin film transistor 72, a third thin film transistor 73 and a fourth thin film transistor T4; a drain electrode and a gate electrode of the first thin film transistor T1 are respectively connected to the signal line L1; a drain electrode and a gate electrode of the second thin film transistor T2 are respectively connected to the electro-static lead-out line L2; a source electrode of the first thin film transistor T1, a source electrode of the second thin film transistor T2, a gate electrode of the third thin film transistor T3 are respectively connected to a first node A; a drain electrode of the third thin film transistor T3 and a drain electrode of the fourth thin film transistor T4 are respectively connected to the signal line L1; a source electrode of the third thin film transistor T3 and a source electrode of the fourth thin film transistor T4 are respectively connected to the electro-static lead-out line L2.

In the abovementioned display substrate provided by the embodiment of the present disclosure, because the drain electrode and the gate electrode of the first thin film transistor T1 are respectively connected to the signal line L1, the source electrode of the first thin film transistor T1 and the gate electrode of the third thin film transistor T3 are respectively connected to the first node A, the drain electrode of the third thin film transistor T3 and the drain electrode of the fourth thin film transistor T4 are respectively connected to the signal line L1, and the source electrode of the third thin film transistor T3 and the source electrode of the fourth thin film transistor T4 are respectively connected to the electro-static lead-out line L2, upon a large amount of static electricity being accumulated on the signal line L1, the first thin film transistor T1 can be turned on, and then the third thin film transistor T3 and the fourth thin film transistor T4 can be turned on, so that the static electricity on the signal line L can be discharged through the third thin film transistor T3 and the fourth thin film transistor T4 to the electro-static lead-out line L2, and can be guided by the electro-static lead-out line L2. And because the drain electrode and the gate electrode of the second thin film transistor 12 are respectively connected to the electro-static lead-out line L2, the source electrode of the second thin film transistor 72 and the gate electrode of the third thin film transistor T3 are respectively connected to the first node A, the drain electrode of the third thin film transistor T3 and the drain electrode of the fourth thin film transistor T4 are respectively connected to the signal line L1, and the source electrode of the third thin film transistor T3 and the source electrode of the fourth thin film transistor T4 are respectively connected to the electro-static lead-out line L2. Upon a large amount of static electricity being accumulated on the electro-static lead-out line L2, the second thin film transistor T2 can be turned on, and then the third thin film transistor T3 and the fourth thin film transistor T4 can be turned on, so that the static electricity on the electro-static lead-out line L2 can be discharged through the third thin film transistor T3 and the fourth thin film transistor T4 to the signal line L1, and can be guided by a signal source electrode corresponding to the signal line L1.

Therefore, in the electro-static discharge unit provided by the embodiment of the present disclosure, the static electricity can be discharged through two paths of the third thin film transistor T3 and the fourth thin film transistor T4, even if one of the third thin film transistor T3 and the fourth thin film transistor T4 is damaged, the static electricity can still be discharged through the undamaged one of the third thin film transistor T3 and the fourth thin film transistor T4, thereby improving the reliability of the electro-static discharge unit and reducing the risk of the electro-static breakdown of the display substrate. And, the large amount of static electricity accumulated on the signal line L1 or the electro-static lead-out line L2 can be simultaneously discharged through two paths of the thin film transistor T3 and the fourth thin film transistor T4, thereby enhancing the ability of the electro-static discharge unit to discharge the static electricity, so that the large amount of static electricity can be discharged in time and quickly, and the damage to the display substrate caused by untimely discharge of the static electricity can be avoided.

Furthermore, because a volume of the thin film transistor is smaller than that of the capacitor, compared with an electro-static discharge unit composed of two capacitors and one thin film transistor in the known technology, in the embodiment of the present disclosure, the electro-static discharge unit composed of the first thin film transistor T1, the second thin film transistor T2, the third thin film transistor T3 and the fourth thin film transistor T4 has a smaller volume, thereby reducing the wiring space of the electro-static discharge unit, so as to achieve a narrow frame design of the display substrate.

A channel length-width ratio of the thin film transistor determines the amount of current flowing between the source electrode and the drain electrode. The larger the channel length-width ratio is, the larger the current flows. Therefore, a length and a width of the channel of the thin film transistor should be determined according to design parameters and requirements, to obtain the desired aspect ratio.

In order to make the electro-static discharge unit play a role in quickly and evenly discharging static electricity, in the abovementioned display substrate provided by embodiments of the present disclosure, a channel length-width ratio of the fourth thin film transistor T4 can be the same as that of the third thin film transistor 73, so that upon the static electricity being discharged through the fourth thin film transistor T4 and the third thin film transistor T3, the current flowing the source electrode and the drain electrode of the third thin film transistor T3 is the same as the current flowing the source electrode and the drain electrode of the fourth thin film transistor T4, thereby achieving rapid and balanced discharge of the static electricity.

Furthermore, in a case where it is ensured that the channel length-width ratio of the fourth thin film transistor T4 is the same as that of the third thin film transistor T3, and the channel length-width ratio of the fourth thin film transistor T4 and the third thin film transistor T3 is disposed to be coincide with a channel length-width ratio of the existing thin film transistor T as illustrated in FIG. 1, test results show that compared with the electro-static discharge unit illustrated in FIG. 1, the electro-static discharge unit provided by the embodiment of the present disclosure has a strong ability to discharge static electricity, thereby solving the problem that a large amount of static electricity cannot be discharged in time and quickly, and the electro-static damage to the display substrate due to the static discharge ability of the electro-static discharge unit is weak.

Certainly, in a specific implementation, the channel length-width ratio of the third thin film transistor T3 can also be different from that of the fourth thin film transistor T4, which is not limited thereto.

In the abovementioned display substrate provided by an embodiment of the present disclosure, upon a large amount of static electricity being accumulated on the signal line L, the thin film transistor T1 is turned on, and then the thin film transistor T3 and the thin film transistor T4 are turned on to achieve the discharge of the static electricity. Assuming that the thin film transistor T1 is damaged, the thin film transistor T3 and the thin film transistor T4 cannot be turned on, thereby causing the electro-static discharge unit to fail, and increasing the risk of the display substrate being electro-statically broken down.

Figure 3:
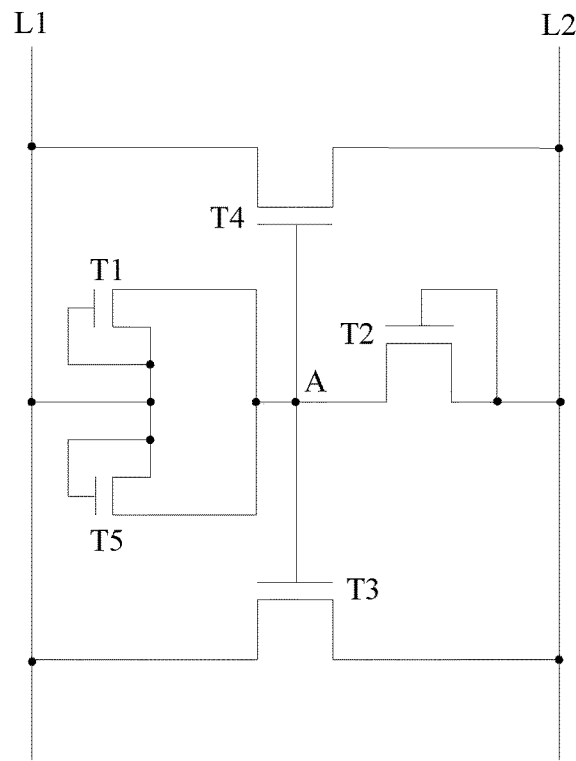

Therefore, in order to further improve the reliability of the electro-static discharge unit and reduce the risk of electro-static breakdown of the display substrate, in the abovementioned display substrate provided by the embodiment of the present disclosure, as illustrated in FIG. 3, the electro-static discharge unit can further include a fifth thin film transistor T5; a drain electrode and a gate electrode of the fifth thin film transistor T5 are respectively connected to the signal line L1; a source electrode of the fifth thin film transistor T5 is connected to the first node A.

In this way, the fifth thin film transistor 75 is increased to connect the signal line L, so that the large amount of static electricity accumulated on the signal line L1 can turn on the first thin film transistor T1 and/or the fifth thin film transistor T75, and then the third thin film transistor T3 and the fourth thin film transistor T4 can be controlled to turn on by the first thin film transistor T1 and/or the fifth thin film transistor T5, so that the large amount of static electricity accumulated on the signal line L can be discharged through the third thin film transistor T3 and the fourth thin film transistor T4 to the electro-static lead-out line L2, and then guided by the electro-static lead-out line. Thus, even if one of the first thin film transistor T1 and the fifth thin film transistor T5 is damaged, the third thin film transistor T3 and the fourth thin film transistor T4 can still be controlled to be turned on by another intact thin film transistor to achieve the discharge of the static electricity, thereby further improving the reliability of an electro-static protection unit and reducing the risk of the electro-static breakdown of the display substrate.

In order to simplify the production process and improve production efficiency, in the abovementioned display substrate provided by the embodiment of the present disclosure, a channel length-width ratio of the fifth thin film transistor T5 can be disposed to be the same as that of the first thin film transistor T1. Certainly, in a specific implementation, the channel length-width ratio of the first thin film transistor T1 can also be different from that of the fifth thin film transistor T5, which is not limited thereto.

Based on the same principle, in the abovementioned display substrate provided by the embodiment of the present disclosure, upon a large amount of static electricity being accumulated on the electro-static lead-out line L2, the thin film transistor T2 can be turned on, and then the thin film transistor T3 and the thin film transistor T4 can be turned on to achieve the discharge of the static electricity. Assuming that the thin film transistor T2 is damaged, the thin film transistor T3 and the thin film transistor T4 cannot be turned on, thereby causing the electro-static discharge unit to fail, and increasing the risk of the display substrate being electro-statically broken down.

Figure 4:
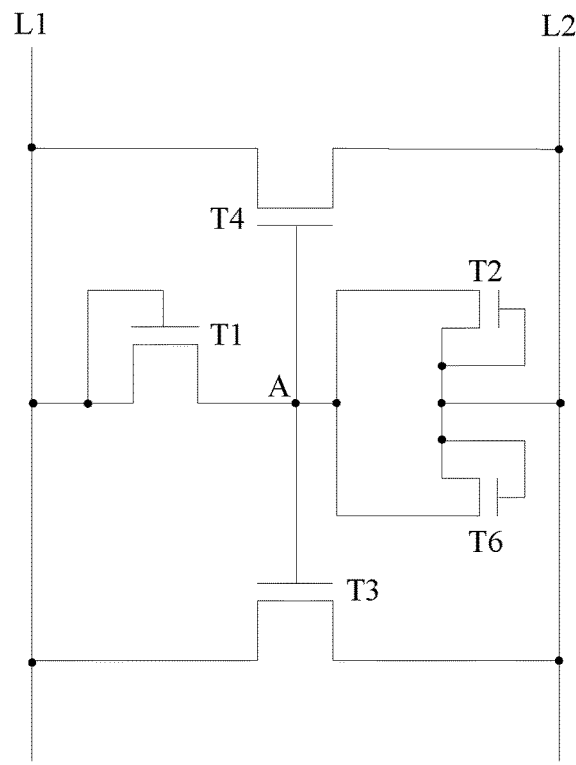

Therefore, in order to further improve the reliability of the electro-static discharge unit and reduce the risk of electro-static breakdown of the display substrate, in the abovementioned display substrate provided by the embodiment of the present disclosure, as illustrated in FIG. 4, the electro-static discharge unit can further include a sixth thin film transistor T6; a drain electrode and a gate electrode of the sixth thin film transistor T6 are connected to the electro-static lead-out line L2; a source electrode of the sixth thin film transistor T6 is connected to the first node A.

In this way, the sixth thin film transistor T6 is increased to connect the electro-static lead-out line L2, so that the large amount of static electricity accumulated on the electro-static lead-out line L2 can turn on the second thin film transistor 72 and/or the sixth thin film transistor T6, and then the third thin film transistor T3 and the fourth thin film transistor T4 can be controlled to turn on through the second thin film transistor T2 and/or the sixth thin film transistor T6, so that the large amount of static electricity accumulated on the electro-static lead-out line L2 can be discharged through the third thin film transistor T3 and the fourth thin film transistor T4 to the signal line L1, and then guided by the signal line L1. Thus, even if one of the second thin film transistor 72 and the sixth thin film transistor T6 is damaged, the third thin film transistor T3 and the fourth thin film transistor T4 can still be controlled to be turned on by another intact thin film transistor to achieve the discharge of the static electricity, thereby further improving the reliability of an electro-static protection unit and reducing the risk of the electro-static breakdown of the display substrate.

In order to simplify the production process and improve production efficiency, in the abovementioned display substrate provided by the embodiment of the present disclosure, a channel length-width ratio of the sixth thin film transistor T6 can be disposed to be the same as that of the second thin film transistor 72. Certainly, in a specific implementation, the channel length-width ratio of the second thin film transistor 72 can also be different from that of the sixth thin film transistor T6, which is not limited thereto.

Figure 5:
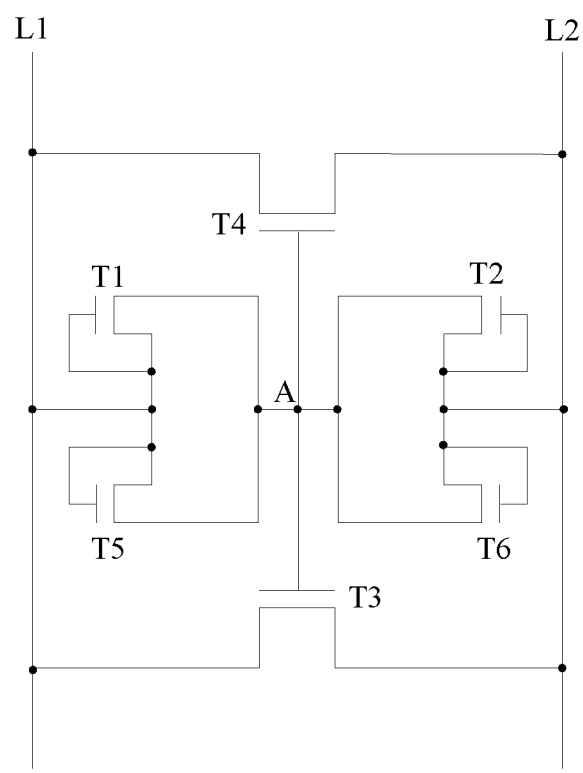

In the abovementioned display substrate provided by the embodiment of the present disclosure, in order to ensure a large amount of static electricity accumulated on the signal line L1 and the electro-static lead-out line L2 can be smoothly discharged. As illustrated in FIG. 5, the electro-static discharge unit can also simultaneously include: the fifth thin film transistor T5 and the sixth thin film transistor T6; the source electrode of the fifth thin film transistor T5 and the source electrode of the sixth thin film transistor T6 are electrically connected to the first node A; the drain electrode and the gate electrode of the fifth thin transistor T5 are respectively connected to the signal line L1. The drain electrode and the gate electrode of the sixth thin film transistor T6 are respectively connected to the electro-static lead-out line L2.

In this way, the first thin film transistor T1 and the fifth thin film transistor T5 connected to the signal line L play a role of double safety switches, simultaneously, the second thin film transistor T2 and the sixth thin film transistor T6 connected to the electro-static lead-out line L2 can also play a role of double safety switches, thereby improving the reliability of the electro-static discharge unit and reducing the risk of electro-static breakdown of the display substrate. And the static electricity can be discharged through two paths of the third thin film transistor T3 and the fourth thin film transistor T4, thereby improving the speed of electro-static discharge and achieving the effect of equalizing discharge; simultaneously, because the static electricity can be discharged through the third thin film transistor T3 and the fourth thin film transistor T4, even if one of the third thin film transistor T3 and the fourth thin film transistor T4 is damaged, the static electricity can be discharged through intact one of the third thin film transistor T3 and the fourth thin film transistor T4, thereby improving the reliability of the electro-static discharge unit and reducing the risk of the electro-static breakdown of the display substrate.

It can be seen from the abovementioned description, in the abovementioned display substrate provided by the embodiment of the present disclosure, the reliability of the electro-static discharge unit can be improved and the risk of the electro-static breakdown of the display substrate can be reduced by increasing a thin film transistor as an electro-static discharge path in the electro-static discharge unit; and/or increasing a thin film transistor that acts as a switch connected to the signal line L1; and/or increasing a thin film transistor that acts as a switch connected to the electro-static lead-out line L2. Therefore, according to actual condition, it is also possible to reasonably increase the number of thin film transistors connected to the signal line L1, the number of thin film transistors connected to the electro-static lead-out line L2, and the number of thin film transistors as electro-static discharge paths to improve the reliability of an electro-static protection unit and reduce the risk of electro-static breakdown of the display substrate, which is not limited thereto.

It should be noted that, in the abovementioned display substrate provided by the embodiment of the present disclosure, the source electrode and the drain electrode of all thin film transistors constituting the electro-static discharge unit can be interchangeable, which is not limited thereto.

And, in order to reduce the difficulty of the manufacturing process, thin film transistors generally use transistors of the same material. Therefore, all of the abovementioned thin film transistors use N-type thin film transistors.

It should be noted that, upon a gate electrode electric potential of an N-type thin film transistor being a high potential, the thin film transistor is turned on, and upon the gate electrode electric potential of the N-type thin film transistor being a low potential, the thin film transistor is turned off.

In the abovementioned display substrate provided by the embodiment of the present disclosure, the signal line L1 can be a data signal line, a gate electrode signal line, a control signal line, a clock signal line, or a test signal line; the signal line L1 can also be any combination of a data signal line, a gate electrode signal line, a control signal line, a clock signal line, and a test signal line; certainly, the signal line L can also be other signal line in the display substrate known to those skilled in the art, which is not limited thereto.

In the abovementioned display substrate provided by the embodiment of the present disclosure, the electro-static lead-out line L2 can be a common electrode line or grounded, which is not limited thereto. For example, a shape of the electro-static lead-out line L2 may be a fold line or a straight line, and may also include a ring structure, and the shape of the electro-static lead-out line L2 is not limited in the embodiment of the present disclosure. For example, the electro-static lead-out line L2 uses a discharge line with a large line width and a large current carrying capacity.

An embodiment of the present disclosure further provides a display device, including the abovementioned display substrate provided by the embodiment of the present disclosure, the display device can be a mobile phone, a tablet computer, a television, a display module, a notebook computer, a digital photo frame, a navigator, a smart watch, a fitness wristband, a personal digital assistant, etc., any product or component having a display function. The implementation of the display device can refer to the abovementioned embodiment of the display substrate, and the details are not repeated here.

The abovementioned display substrate and the display device provided by the embodiment of the present disclosure include: the signal line located in the display region of the display substrate, and the electro-static discharge unit and the electro-static lead-out line in the frame region, wherein the electro-static discharge unit includes the first thin film transistor, the second thin film transistor, the third thin film transistor and the fourth thin film transistor, because the drain electrode and the gate electrode of the first thin film transistor are respectively connected to the signal line, the source electrode of the first thin film transistor and the gate electrode of the third thin film transistor are connected to the first node, the drain electrode of the third thin film transistor is connected to the signal line, and the source electrode of the third thin film transistor is connected to the electro-static lead-out line, upon a large amount of static electricity being accumulated on the signal line, the first thin film transistor can be turned on, and then the thin film transistor and the fourth thin film transistor can be turned on, so that the static electricity on the signal line can be discharged through the third thin film transistor and the fourth thin film transistor to the electro-static lead-out line, and can be guided by the electro-static lead-out line. And, because the drain electrode and the gate electrode of the second thin film transistor are respectively connected to the electro-static lead-out line, the source electrode of the second thin film transistor and the gate electrode of the third thin film transistor are respectively connected to the first node, a drain electrode of the third thin film transistor and a drain electrode of the fourth thin film transistor are respectively connected to the signal line, the source electrode of the third thin film transistor and the source electrode of the fourth thin film transistor are connected to the electro-static lead-out line. Upon a large amount of static electricity being accumulated on the electro-static lead-out line, the second thin film transistor can be turned on, and then the third thin film transistor and the fourth thin film transistor can be turned on, so that the static electricity on the electro-static lead-out line can be discharged through the third thin film transistor and the fourth thin film transistor to the signal line, and can be guided by a signal source electrode corresponding to the signal line.

Therefore, in the electro-static discharge unit provided by the embodiment of the present disclosure, the static electricity can be discharged through two paths of the third thin film transistor and the fourth thin film transistor, even if one of the third thin film transistor and the fourth thin film transistor is damaged, the static electricity can be discharged through undamaged one of the third thin film transistor and the fourth thin film transistor, thereby improving the reliability of the electro-static discharge unit and reducing the risk of the electro-static breakdown of the display substrate. And the large amount of static electricity accumulated on the signal line or the electro-static lead-out line can be simultaneously discharged through two paths of the third thin film transistor and the fourth thin film transistor, thereby enhancing the ability of the electro-static discharge unit to discharge the static electricity, so that a large amount of static electricity can be discharged in time and quickly, and the damage to the display substrate caused by untimely discharge of the static electricity can be avoided.

Furthermore, because a volume of the thin film transistor is smaller than that of the capacitor, compared with an electro-static discharge unit composed of two capacitors and one thin film transistor in the prior art, in the embodiment of the present disclosure, the electro-static discharge unit composed of the first thin film transistor, the second thin film transistor, the third thin film transistor and the fourth thin film transistor has a smaller volume, thereby reducing the wiring space of the electro-static discharge unit, so as to achieve a narrow frame design of the display substrate.

The beneficial effects of the present disclosure are as follows:

A display substrate and a display device provided by the embodiment of the present disclosure include: a signal line located in a display region of the display substrate, and an electro-static discharge unit and an electro-static lead-out line in a frame region, wherein the electro-static discharge unit includes a first thin film transistor, a second thin film transistor, a third thin film transistor and a fourth thin film transistor, because a drain electrode and a gate electrode of the first thin film transistor are respectively connected to the signal line, a source electrode of the first thin film transistor and a gate electrode of the third thin film transistor are connected to a first node, a drain electrode of the third thin film transistor is connected to the signal line, and a source electrode of the third thin film transistor is connected to the electro-static lead-out line, upon a large amount of static electricity being accumulated on the signal line, the first thin film transistor can be turned on, and then the third thin film transistor and the fourth thin film transistor can be turned on, so that the static electricity on the signal line can be discharged through the third thin film transistor and the fourth thin film transistor to the electro-static lead-out line, and can be guided by the electro-static lead-out line. And, because the drain electrode and the gate electrode of the second thin film transistor are respectively connected to the electro-static lead-out line, the source electrode of the second thin film transistor and the gate electrode of the third thin film transistor are respectively connected to the first node, the drain electrode of the third thin film transistor and the drain electrode of the fourth thin film transistor are respectively connected to the signal line, the source electrode of the third thin film transistor and the source electrode of the fourth thin film transistor are connected to the electro-static lead-out line. Upon a large amount of static electricity being accumulated on the electro-static lead-out line, the second thin film transistor can be turned on, and then the third thin film transistor and the fourth thin film transistor can be turned on, so that the static electricity on the electro-static lead-out line can be discharged through the third thin film transistor and the fourth thin film transistor to the signal line, and can be guided by a signal source electrode corresponding to the signal line.

Therefore, in the electro-static discharge unit provided by the embodiment of the present disclosure, the static electricity can be discharged through two paths of the third thin film transistor and the fourth thin film transistor, even if one of the third thin film transistor and the fourth thin film transistor is damaged, the static electricity can be discharged through undamaged one of the third thin film transistor and the fourth thin film transistor, thereby improving the reliability of the electro-static discharge unit and reducing the risk of the electro-static breakdown of the display substrate. And the large amount of static electricity accumulated on the signal line or the electro-static lead-out line can be simultaneously discharged through two paths of the third thin film transistor and the fourth thin film transistor, thereby enhancing the ability of the electro-static discharge unit to discharge the static electricity, so that a large amount of static electricity can be discharged in time and quickly, and the damage to the display substrate caused by untimely discharge of the static electricity can be avoided.

Furthermore, because a volume of the thin film transistor is smaller than that of the capacitor, compared with an electro-static discharge unit composed of two capacitors and one thin film transistor in the prior art, in the embodiment of the present disclosure, the electro-static discharge unit composed of the first thin film transistor, the second thin film transistor, the third thin film transistor and the fourth thin film transistor has a smaller volume, thereby reducing the wiring space of the electro-static discharge unit, so as to achieve a narrow frame design of the display substrate.

It should be noted that, in the present disclosure, relationship terms such as first and second are used merely to distinguish one entity or operation from another entity or operation, and do not necessarily require or imply any such actual relationship or order between these entities or operations.

The foregoing is only the embodiments of the present disclosure and not intended to limit the scope of protection of the present disclosure, the protection scope of the present disclosure should be based on the protection scope of the claims.

What is claimed is:

1. A display substrate, comprising: a signal line located in a display region of the display substrate, and an electro-static discharge unit and an electro-static lead-out line in a frame region of the display substrate, wherein
   the electro-static discharge unit comprises a first thin film transistor, a third thin film transistor and a fourth thin film transistor;
   a drain electrode and a gate electrode of the first thin film transistor are respectively connected to the signal line;
   a source electrode of the first thin film transistor, a gate electrode of the third thin film transistor and a gate electrode of the fourth thin film transistor are respectively connected to a first node;
   a drain electrode of the third thin film transistor and a drain electrode of the fourth thin film transistor are respectively connected to the signal line;
   a source electrode of the third thin film transistor and a source electrode of the fourth thin film transistor are respectively connected to the electro-static lead-out line,
   the electro-static discharge unit further comprises: a fifth thin film transistor;
   a drain electrode and a gate electrode of the fifth thin film transistor are respectively connected to the signal line;
   a source electrode of the fifth thin film transistor is connected to the first node.

2. The display substrate according to claim 1, wherein a channel length-width ratio of the fourth thin film transistor is the same as that of the third thin film transistor.

3. The display substrate according to claim 1, wherein a channel length-width ratio of the fifth thin film transistor is the same as that of the first thin film transistor.

4. The display substrate according to claim 1, wherein the electro-static discharge unit further comprises: a sixth thin film transistor;
   a drain electrode and a gate electrode of the sixth thin film transistor are respectively connected to the electro-static lead-out line;
   a source electrode of the sixth thin film transistor is connected to the first node.

5. The display substrate according to claim 4, wherein a channel length-width ratio of the sixth thin film transistor is the same as that of the second thin film transistor.

6. The display substrate according to claim 1, wherein the signal line is one or a combination of a data signal line, a gate electrode signal line, a control signal line, a clock signal line, and a test signal line.

7. The display substrate according to claim 1, wherein the electro-static lead-out line is grounded, or the electro-static lead-out line is a common electrode line.

8. A display device, comprising the display substrate according to claim 1.

9. The display substrate according to claim 1, wherein the electro-static discharge unit further comprises:
   a second thin film transistor, wherein a drain electrode and a gate electrode of the second thin film transistor are respectively connected to the electro-static lead-out line, a source electrode of the second thin film transistor is connected to the first node.

10. An electro-static discharge unit, comprising:
   a first thin film transistor, a third thin film transistor and a fourth thin film transistor;
   a drain electrode and a gate electrode of the first thin film transistor are respectively connected to a signal line;
   a source electrode of the first thin film transistor, a gate electrode of the third thin film transistor and a gate electrode of the fourth thin film transistor are respectively connected to a first node;
   a drain electrode of the third thin film transistor and a drain electrode of the fourth thin film transistor are respectively connected to the signal line;
   a source electrode of the third thin film transistor and a source electrode of the fourth thin film transistor are respectively connected to an electro-static lead-out line,
   the electro-static discharge unit further comprises: a fifth thin film transistor;
   a drain electrode and a gate electrode of the fifth thin film transistor are respectively connected to the signal line;
   a source electrode of the fifth thin film transistor is connected to the first node.

11. The electro-static discharge unit according to claim 10, further comprising:
   a second thin film transistor, wherein a drain electrode and a gate electrode of the second thin film transistor are respectively connected to the electro-static lead-out line, a source electrode of the second thin film transistor is connected to the first node.

12. The electro-static discharge unit according to claim 11, wherein a channel length-width ratio of the fourth thin film transistor is the same as that of the third thin film transistor.

13. The electro-static discharge unit according to claim 10, wherein a channel length-width ratio of the fifth thin film transistor is the same as that of the first thin film transistor.

14. The electro-static discharge unit according to claim 10, further comprising: a sixth thin film transistor;
   a drain electrode and a gate electrode of the sixth thin film transistor are respectively connected to the electro-static lead-out line;
   a source electrode of the sixth thin film transistor is connected to the first node.

15. The electro-static discharge unit according to claim 14, wherein a channel length-width ratio of the sixth thin film transistor is the same as that of the second thin film transistor.

* * * * *